United States Patent [19]
Schmidt

[11] Patent Number: 5,838,179
[45] Date of Patent: Nov. 17, 1998

[54] CLOCK COMPENSATION CIRCUIT

[75] Inventor: Steven G. Schmidt, Mount Holly, N.J.

[73] Assignee: General Signal Corporation, Stamford, Conn.

[21] Appl. No.: 798,939

[22] Filed: Feb. 11, 1997

[51] Int. Cl.[6] .............................. H03K 5/13; H03L 7/06
[52] U.S. Cl. ..................... 327/156; 327/158; 327/276
[58] Field of Search ...................... 327/292–295, 327/299, 147, 149–153, 156, 158–163, 276, 277, 278

[56] References Cited

U.S. PATENT DOCUMENTS

| | | | |
|---|---|---|---|
| 4,637,018 | 1/1987 | Flora et al. ............................. | 327/152 |
| 5,043,596 | 8/1991 | Masuda et al. ......................... | 327/297 |
| 5,118,975 | 6/1992 | Hillis et al. ............................ | 327/158 |
| 5,430,397 | 7/1995 | Itoh et al. .............................. | 327/295 |

*Primary Examiner*—Tuan T. Lam
*Attorney, Agent, or Firm*—Ohlandt, Greeley, Ruggiero & Perle

[57] ABSTRACT

A clock compensation circuit includes a clock tree; a reference clock; a phase detector for detecting relative phase information of the tree clock and the reference clock; a controller, coupled to said phase detector, for determining and controlling the amount of delay necessary to shift the output of the clock tree in phase with the reference clock; and a programmable delay logic coupled to said controller. The programmable delay logic comprises a string of delay elements that selectively participate in a delay string for shifting the tree clock in phase with the reference clock.

2 Claims, 11 Drawing Sheets

CLOCK COMPENSATION CIRCUIT

This application claims the benefit of U.S. Provisional Application No. 60/021,188 filed Jul. 3, 1996.

FIELD OF INVENTION

This invention relates to a clock compensation circuit and, more particularly, to such a circuit for reducing clock delay and skew in the context of electronic circuits.

DESCRIPTION OF THE PRIOR ART

When designing high speed synchronous logic, a designer must consider for any given synchronous circuit what the min/max data delay is for that circuit. For any synchronous design utilizing a constant clock period, the maximum clock delay plus the maximum clock to output delay should not exceed the clock period. Clock skew, the relative delay of the clock edge from synchronous device to synchronous device must also be minimized. A clock tree is generally utilized to reduce such clock skew. As illustrated in FIG. 1, the clock tree employs several layers of buffering to minimize clock loading for any given clock driver at the output of the tree. Controlling the loading minimizes the skew but as a consequence, increases delay to the final clock tree outputs.

One common method of negating the clock tree's added delay is to add a phase locked loop (PLL) circuit to the input of the clock tree. PLLs are well known in the art. PLLs lock the output of the clock tree in phase with a reference clock. However, PLLs require either a Voltage Controlled Oscillator (VCO) or a Phase-Locked Oscillator and filters and as a consequence, tend to be overly complicated in their construction and operation. When designing a Mask Programmable Gate Array (MPGA) or a semicustom integrated circuit (IC), a VCO may not be available to the designer from the vendors library. If a PLL is available from such a vendor, it generally requires additional I/O pins and other external support circuitry. In order to furnish the man skilled in the art with some examples of systems possessing the aforesaid characteristics, reference may be made to the following U.S. Pat. Nos. 5,521,499 (Goldenberg et al.) and 5,260,608 (Marbot).

It has been discovered that a better approach to remedy this problem is to have a clock compensation circuit which does not utilize any analog circuitry, is completely synchronous and can be constructed from simple gates available from any ASIC vendor's library.

Accordingly, it is a fundamental object of the present invention to provide a clock compensation circuit as specified above.

It is a further object of the invention to provide a clock compensation circuit for use in high speed CMOS circuitry.

Another object of the invention is to provide a clock compensation circuit having a phase detector which utilizes lag detectors and decoders.

An additional object of the invention is to provide a clock compensation circuit utilizing a programmable delay element constructed of multiplexers.

SUMMARY OF THE INVENTION

A clock compensation circuit incorporating the present invention includes a clock tree; a reference clock; a phase detector for detecting relative phase information of the clock tree and the reference clock; a controller, coupled to said phase detector, for determining and controlling the amount of delay necessary to shift the output of the clock tree (hereinafter TRECLK) in phase with the reference clock; and a programmable delay logic coupled to said controller. The programmable delay logic comprises a string of delay elements that selectively participate in a delay string for shifting TRECLK in phase with the reference clock.

The present invention provides a clock compensation circuit which is built with ordinary gates available in any ASIC vendor's library. As previously discussed, phased locked loops (PLL) are presently utilized for re-synchronizing a TRECLK to a reference clock. However, PLL-based techniques are overly complicated in their construction and operation because they require special analog oscillators and filters. In designing MPGA or a semicustom IC, such special analog oscillators may not be available from the vendor's library and even if available, would require additional I/O pins and other external support circuitry. In contrast, the unique design of the present invention is not overly complex and does not employ analog oscillators and filters.

The present invention further provides a programmable logic delay (PDL) comprising a string of delay elements in which each delay element is selectively included or excluded from participating in a delay string. In particular, the PDL comprises a string of multiplexers. Each multiplexer has an "A" input from the input clock and a "B" input from a previous multiplexer. Stringing the multiplexers in such a manner allows any multiplexer either to start the delay string, to participate as a delay element in the delay string or to be excluded from the delay string. A "start" multiplexer is selected via a select line by the up/down counter which determines the amount of delay (i.e., which multiplexers will participate in the delay string). As can be appreciated by those skilled in the art, this arrangement ensures that the delay between the TRECLK and the reference clock will never exceed the maximum delay through one PDL multiplexer regardless of temperature, voltage or process. As a result, such a fully digital system is useful for high speed CMOS circuitry where fabrication process parameters, operating voltages and operating temperatures can cause substantial variation of clock delays and clock skews. Moreover, the utilization of such a circuit would substantially reduce clock delay and thus, would free a designer to use liberal clock buffering when minimizing clock skew.

The present invention also provides a phase detector utilizing lag detectors and decoders. A first lag detector detects when the reference clock is lagging TRECLK. If the reference clock is lagging the TRECLK, the first lag detector increases the delay by incrementing the up/down counter. A second lag detector detects when TRECLK is lagging the reference clock. If TRECLK is lagging the reference clock, the second lag detector decreases the delay by decrementing the up/down counter. When TRECLK and the reference clock are 180 degrees out of phase, the phase detector can either increase or decrease delay.

Other and further objects, advantages and features of the present invention will be understood by reference to the following specification in conjunction with the annexed drawings, wherein like parts have been given like numbers.

DESCRIPTION OF THE PREFERRED EMBODIMENTS

Figure 1:
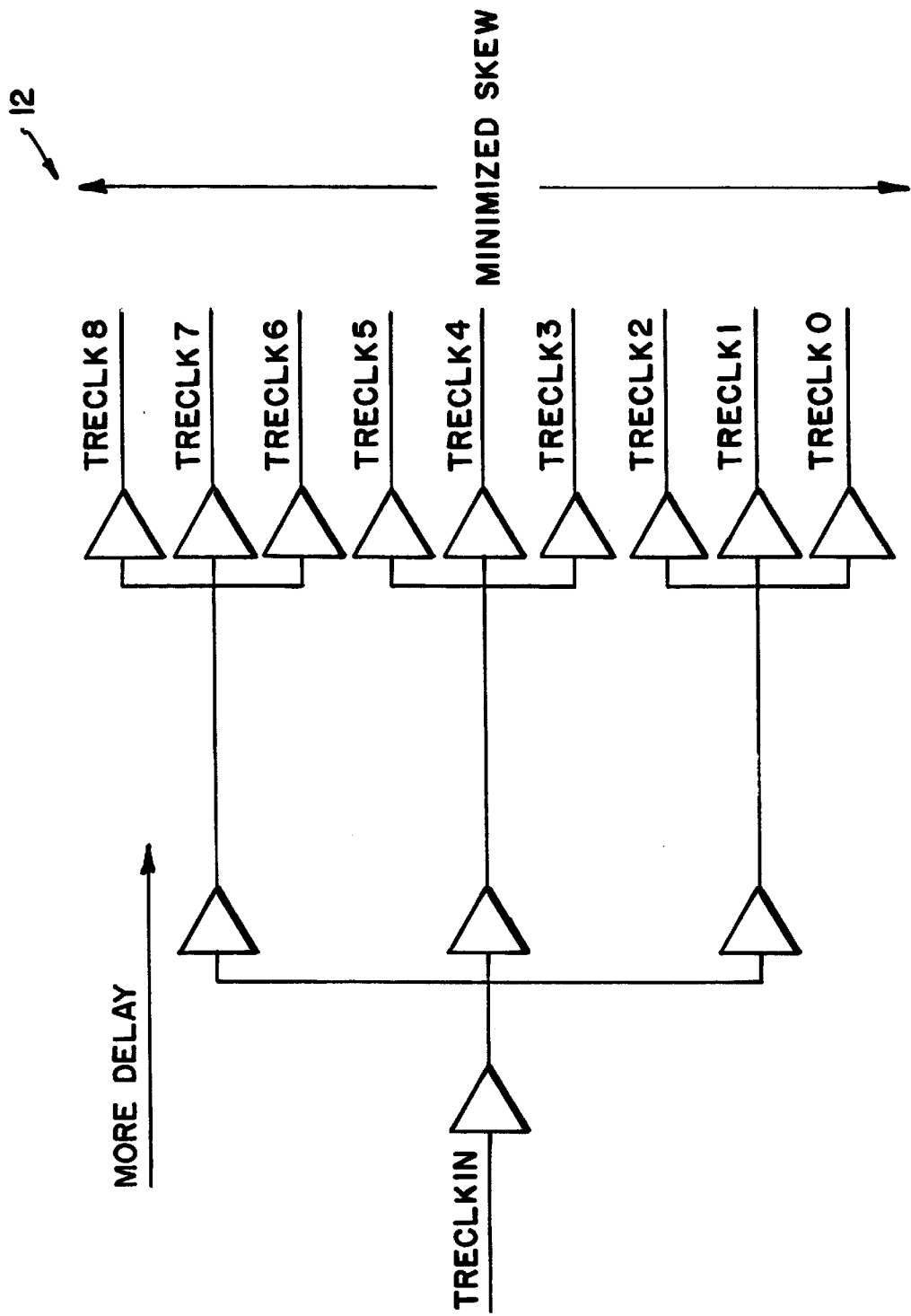
FIG. 1 is a circuit diagram showing a clock tree known in the art.
Figure 2:
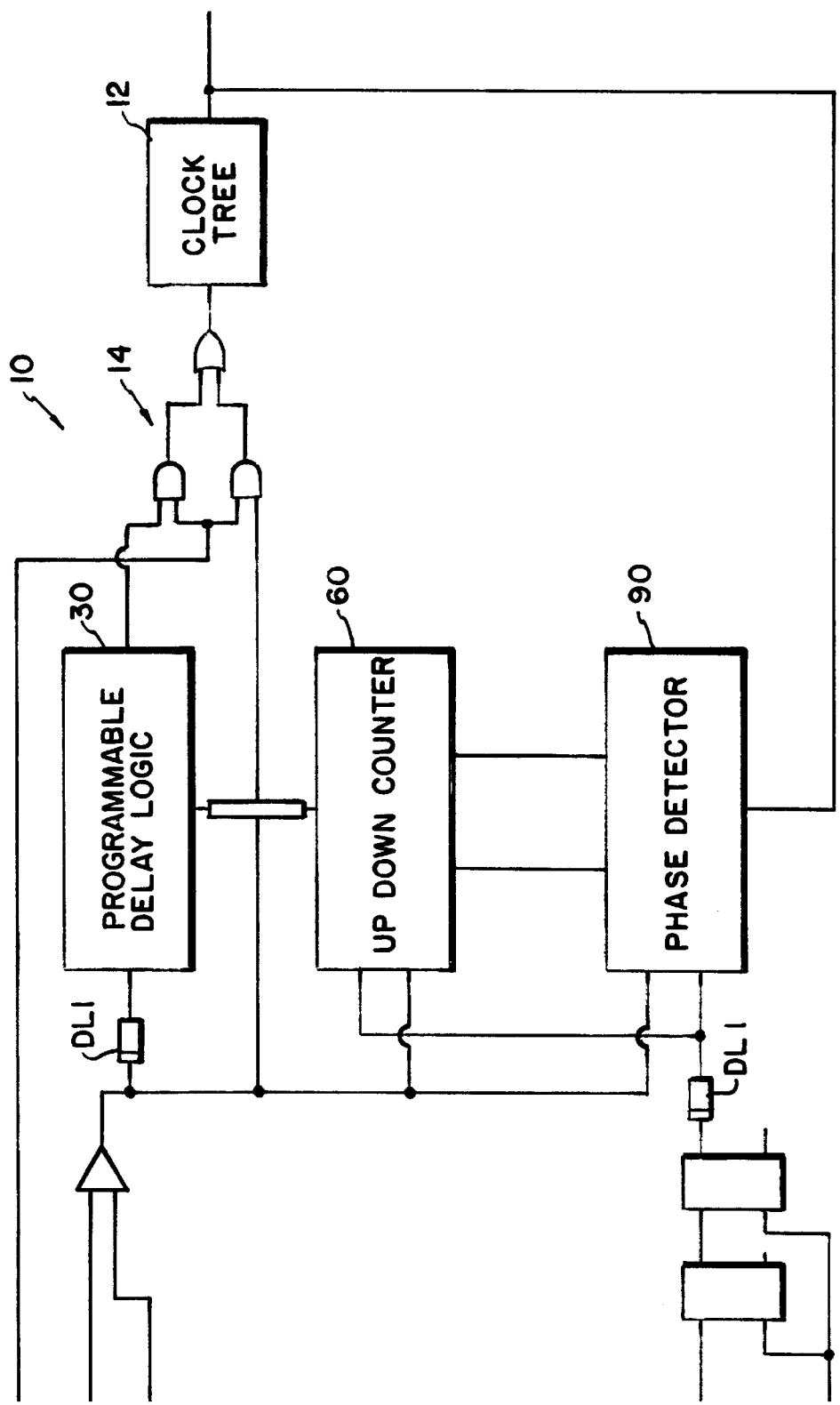
FIG. 2 is a block diagram of the components of a preferred clock compensation circuit in accordance with the present invention.

FIG. 1 describes an arrangement of a clock tree 12 for reducing clock skew. In particular, clock tree 12 employs several layers of buffering to minimize clock loading for any given clock driver at the output of the tree. However, controlling the loading minimizes the clock skew, but increases delay to the final clock tree output (TRECLK). Clock trees are commonly known to those skilled in the art and will not be described in detail herein With reference to FIG. 2, shown is a block diagram of the components of a clock compensation circuit generally indicated by the reference character 10 in accordance with the present invention.

Clock compensation circuit 10 includes a conventional clock tree 12 having an output line (TRECLK); a reference clock (REFCLK); a phase detector 90; a programmable delay logic 30 (hereinafter PDL); and a controller in the form of an up/down counter 60. Clock compensation circuit 10 further includes a multiplexer 14 with its inputs coupled to the clock output (CLKOUT) of PDL 30 and the REFCLK line and its output coupled to the input of a clock tree 12. Multiplexer 14 is designed to select the clock output of PDL 30, when CDCDIS is not asserted. When CDCDIS is asserted, REFCLK is passed through without delay, thereby disabling clock compensation circuit 10. CDCDIS is thus useful for testing the integrity of clock compensation circuit 10. As can be appreciated by those skilled in the art, clock compensation circuit 10, as described herein, can be constructed from simple gates which are available from any ASIC vendor's library.

Figure 6:
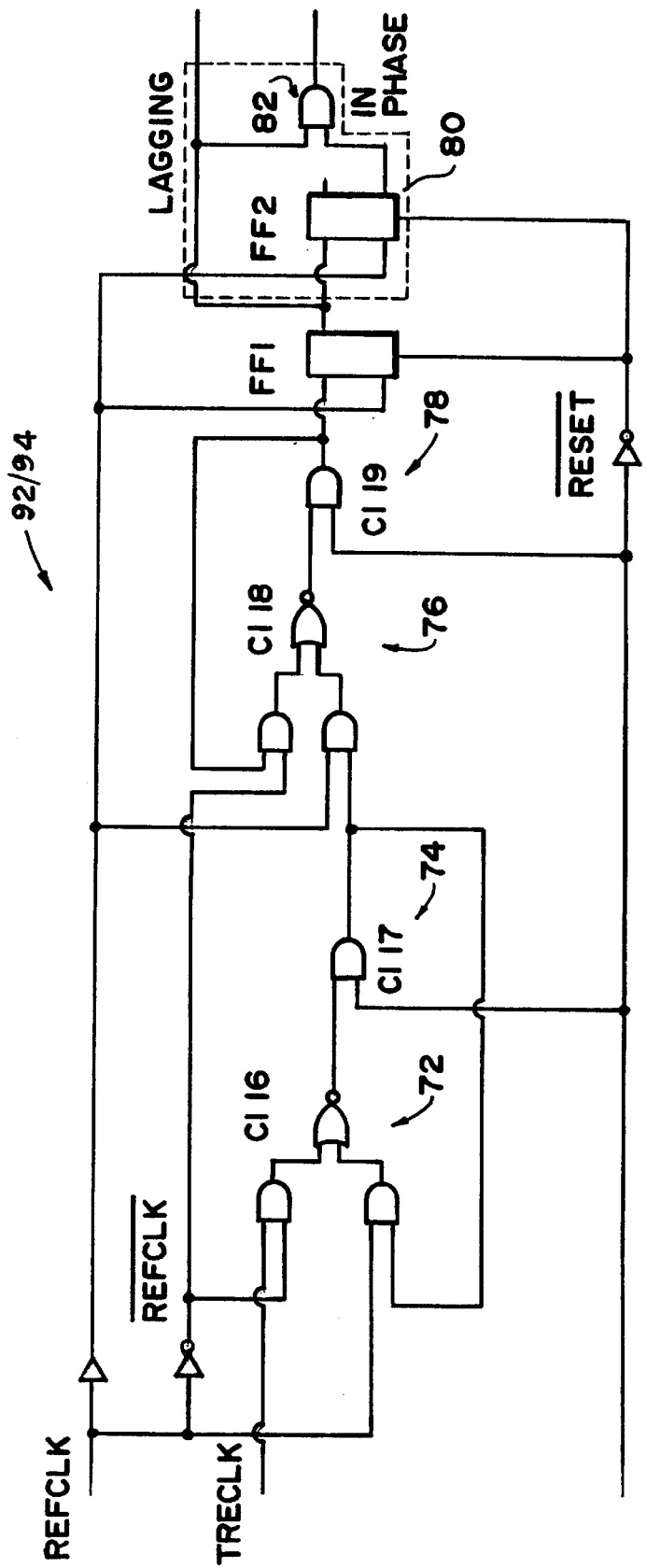
FIG. 6 is a circuit diagram showing a preferred lag detector of FIG. 6.

Referring to FIG. 6, a lag detector 70 includes multiplexers 72 and 76, NOR gates 74 and 78, a flip-flop FF1 and a falling edge detector 80 having a flip-flop FF2 and a NOR gate 82. Multiplexer 72 is designed to select TRECLK (i.e., to sample the tree clock), when REFCLK is low. Multiplexer 76 selects the output of multiplexer 72 when REFCLK rises. If the output of multiplexer 76 is high, FF1 responds with a high output, at a LAGGING output terminal, which indicates that REFCLK is lagging TRECLK. Falling edge detector 80 has its inputs respectively coupled to the output of FF1 and REFCLK. As will be discussed and developed below, falling edge detector 80 is utilized to detect an "in phase" condition, i.e., when TRECLK and REFCLK are in phase.

In an operational example, lag detector 70 samples TRECLK when REFCLK is low at multiplexer 72. When REFCLK rises, multiplexer 76 receives the sample, via NOR gate 74, and passes it to flip-flop FF1, via NOR gate 78. If the sampled value is high, the output of FF1 (LAGGING) is set to high which indicates that REFCLK is lagging TRECLK.

The "in phase" condition is a dynamic detection (FIG. 2). When reset is initiated, an INC output of phase detector 90 is forced true causing additional delay on TRECLK on each rising edge of REFCLK (As discussed further below, phase detector 90 has an INC output, coupled to up/down counter 60, which relays an increment command to up/down counter 60 and as a result, increases the delay to TRECLK).

As TRECLK is delayed on each rising edge of REFCLK, a state will eventually exist where TRECLK is high at a REFCLK rising edge. This state is defined as REFCLK lagging TRECLK and as a result, LAGGING is asserted. As TRECLK is further delayed, a state will eventually exist where TRECLK is low at the rising edge of REFCLK. This transition from a high TRECLK at one rising edge of REFCLK to a low TRECLK at the next rising edge of REFCLK defines the "in phase" state of lag detector 70. With REFCLK no longer lagging TRECLK, this transition will cause a falling edge at NOR gate 78 (FIG. 6). On the next REFCLK, a falling edge will appear on the output of FF1. Falling edge detector 80, via NOR gate 82 and FF2, will detect this falling edge and provide an one cycle pulse at the INPHASE output.

Figure 5:
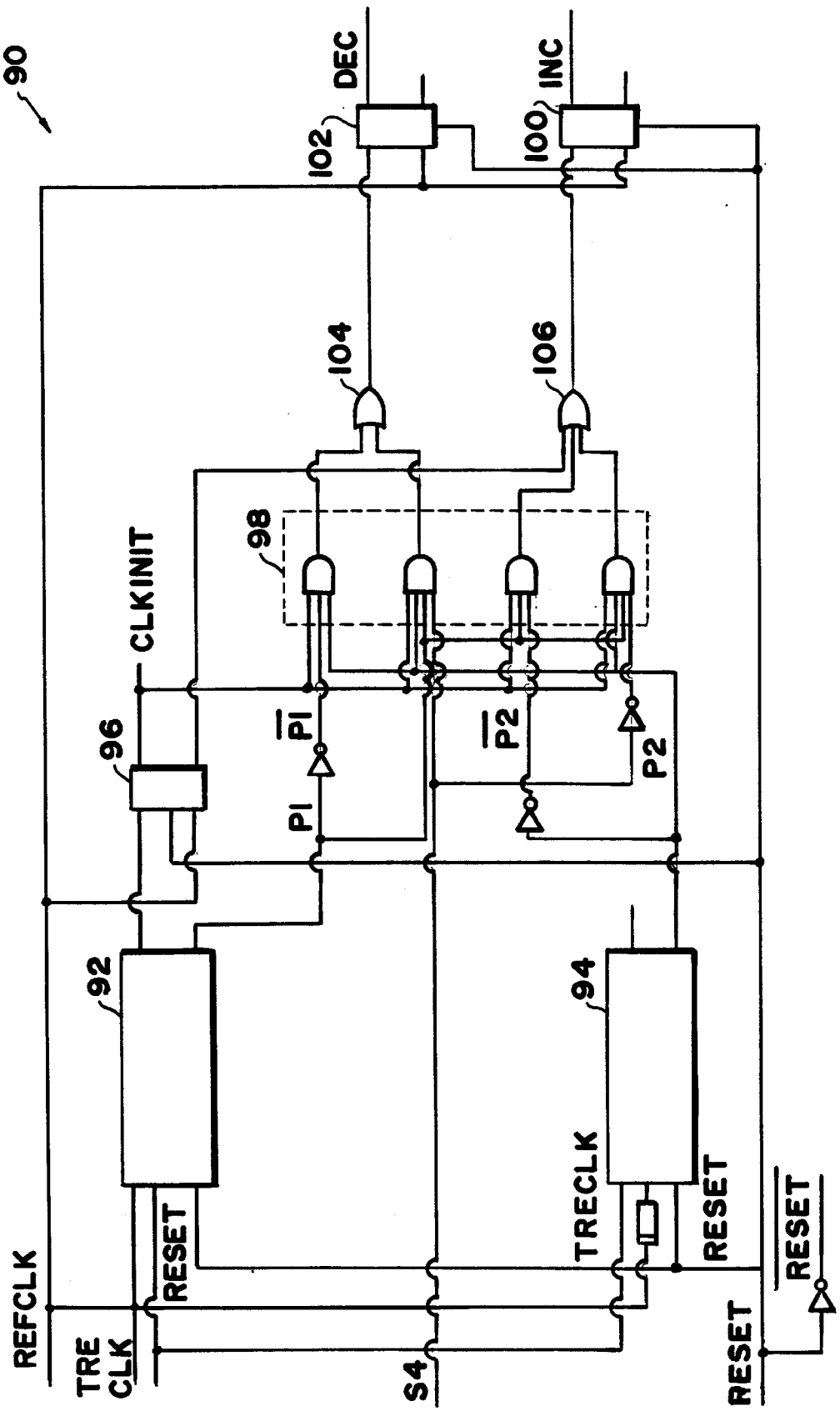
FIG. 5 is a circuit diagram showing a preferred phase detector.

FIG. 5 illustrates a circuit diagram of a preferred phase detector 90 which detects the relationship between REFCLK and TRECLK. Phase detector 90 includes a first lag detector 92 and a second lag detector 94 as previously described, an initialization circuit, some decoder circuitry 98, ordinary flip-flops 100 and 102 and a synchronous SR flip-flop SRFF1. Flip-flop SRFF1 is used to initialize phase detector.

At reset, CLKINIT is cleared and NOT CLKINIT is set, thereby disabling decoder 98 and forcing INC high until INPHASE is asserted by either first lag detector 92 or second lag detector 94. After initialization, phase detector 90 utilizes first lag detector 92 and second lag detector 94 to detect relative phase information of TRECLK and REFCLK. First lag detector 92 has a first input coupled to the TRECLK line and a second input coupled to the REFCLK line (as described in FIGS. 5 and 6) and detects when REFCLK is lagging TRECLK. Second lag detector 94 has its REFCLK and TRECLK inputs reversed (as described in FIG. 5) to detect when TRECLK is lagging REFCLK. Decoder 98 has four AND gates which decode the outputs of lag detectors 92 and 94.

When TRECLK is lagging REFCLK and REFCLK is NOT lagging TRECLK, MORE is asserted to add delay to TRECLK to shift it in phase with REFCLK. When REFCLK is lagging TRECLK and TRECLK is not lagging REFCLK, LESS is asserted to reduce delay on TRECLK to shift it in phase with REFCLK. When TRECLK is lagging REFCLK AND REFCLK is lagging TRECLK, then TRECLK and REFCLK are 180 degrees out of phase. If lag detectors 92 and 94 are 180 degrees out of phase, delay can either be added or reduced.

The most significant bit of the up/down counter 60 (FIG. 4), S4, is utilized to determine whether to add or reduce delay on TRECLK. Specifically, if the count is high, i.e., S4 is set, M180 (FIG. 5) is asserted to reduce delay on TRECLK. If the count is low, i.e., S4 (FIG. 4) is clear, P180 (FIG. 5) is asserted to add delay to TRECLK. The decoded outputs are then Ored together, via OR gates 104 and 106, and passed to flip-flops 100 and 102 to create respective INC and DEC signals.

Alternatively, phase detector 90 can be configured to provide a "phase offset." This may be achieved by adding a delay line to the TRECLK input of either first lag detector 92 or second lag detector 94. Adding delay to the TRECLK input of first lag detector 92 will cause additional offset on TRECLK. Adding delay to the TRECLK input of second lag detector 94 will cause negative offset on TRECLK, i.e., the rising edge of TRECLK will precede the rising edge of REFCLK. Referring to FIG. 5, DL1, located between REFCLK and the TRECLK input of second lag detector 94, causes a 0.5 ns negative offset on TRECLK.

Figure 4:
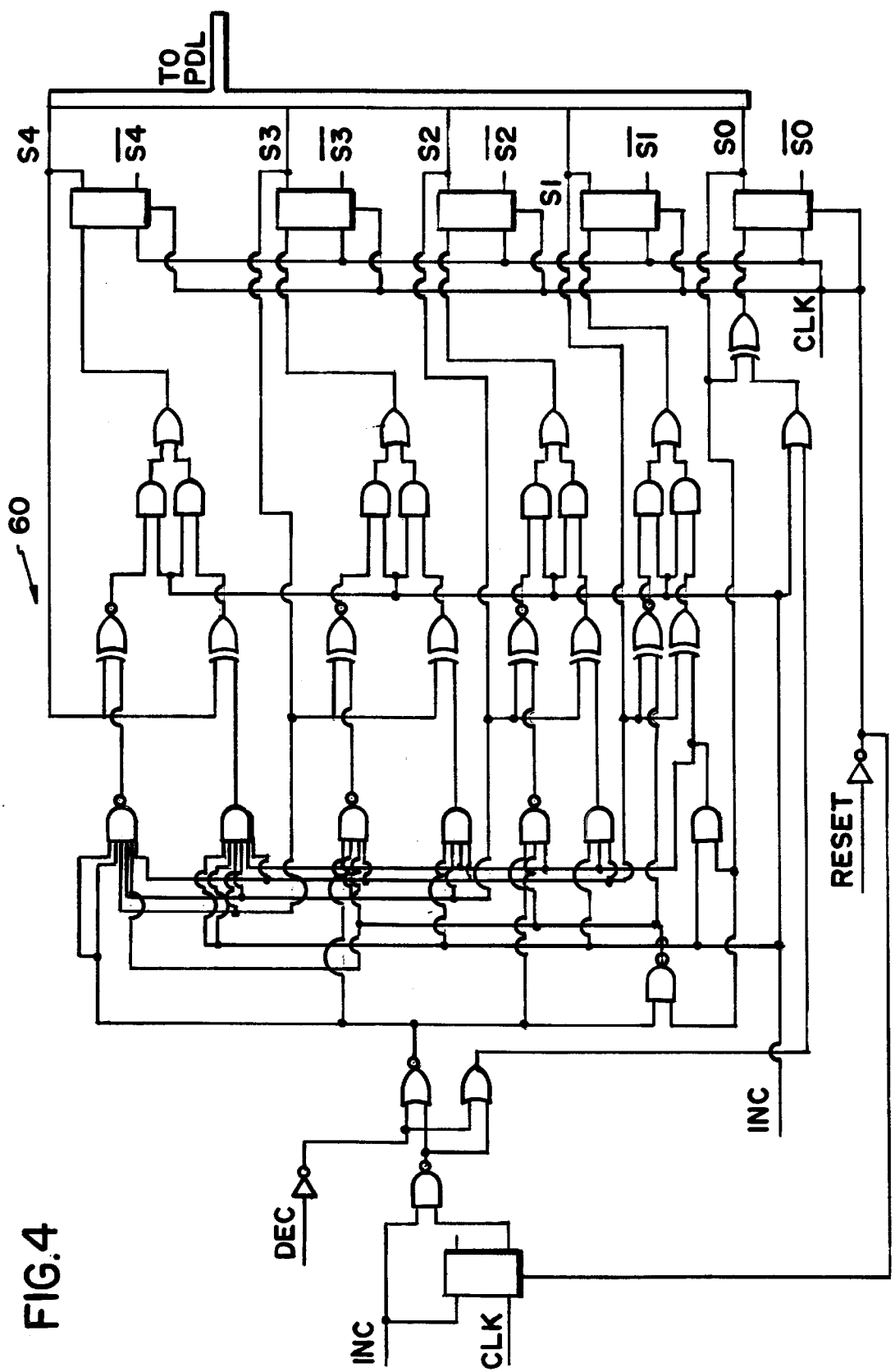
FIG. 4 is a circuit diagram showing a preferred up/down counter.

Referring to FIG. 4, up/down counter 60 is a synchronous, binary, up/down counter with a increment input, INC, and decrement input, DEC. The outputs of phase detector 90, INC and DEC, are respectively coupled to the INC and DEC inputs of up/down counter 60 and simply, increase or decrease the count accordingly. Up/down counter 60 is a conventional up/down counter except for one unique feature, it decrements by 1 when the increment signal is released. This feature is included to compensate for phase detector 90 which over increments by one when it is adding delay to the delay count.

Figure 3:
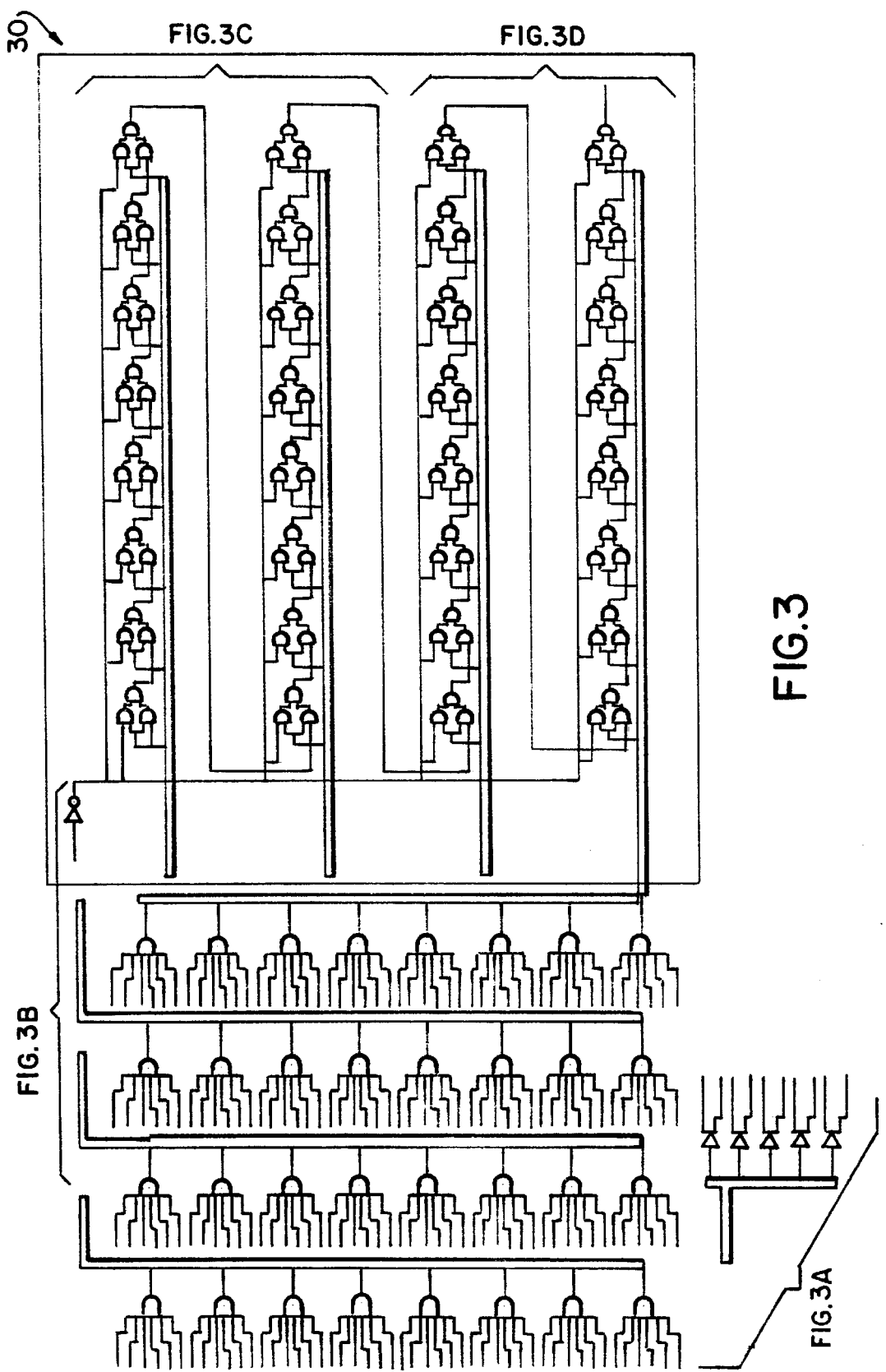
FIG. 3 is a circuit diagram showing a preferred programmable delay logic.
Figure 3A:
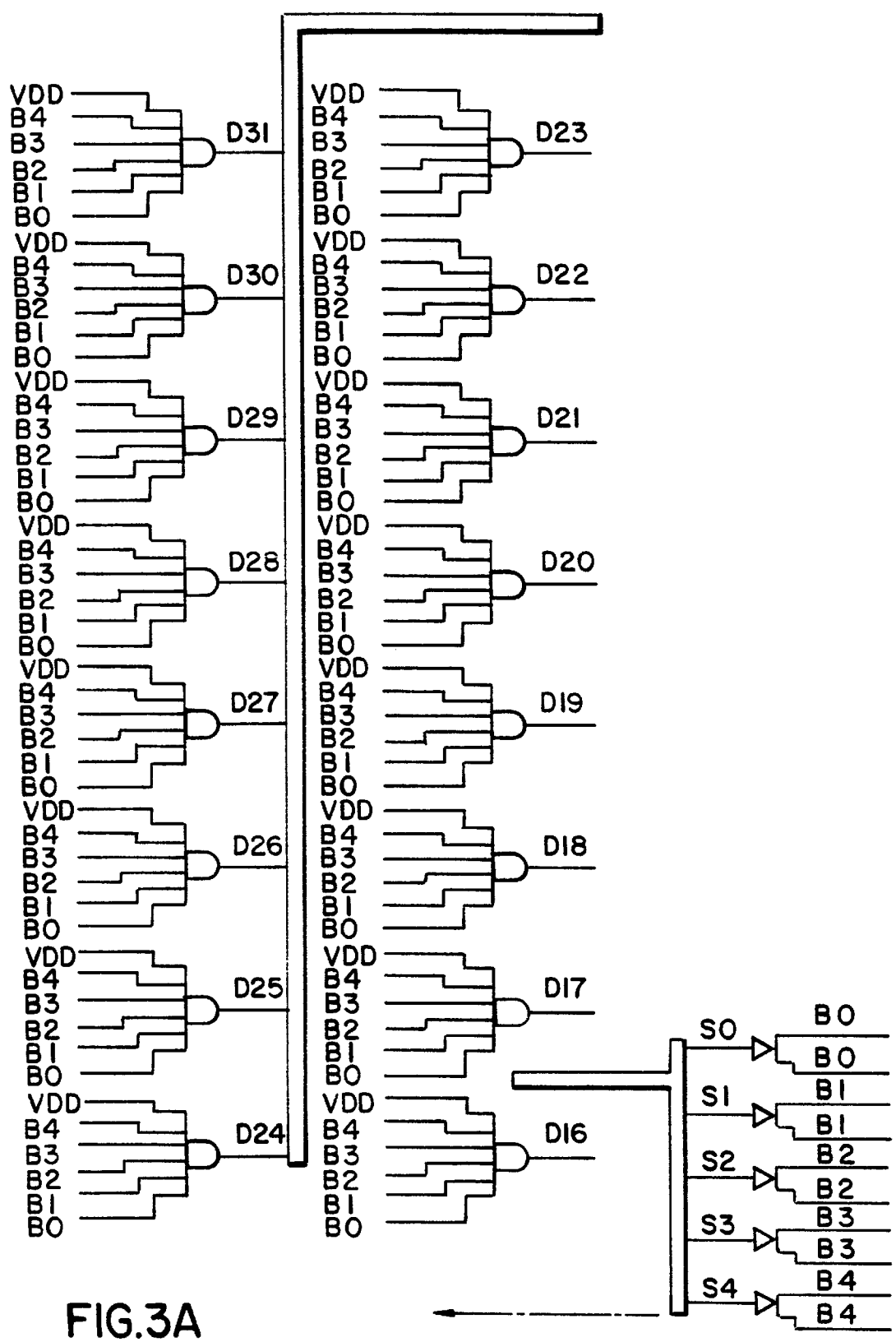
Figure 3B:
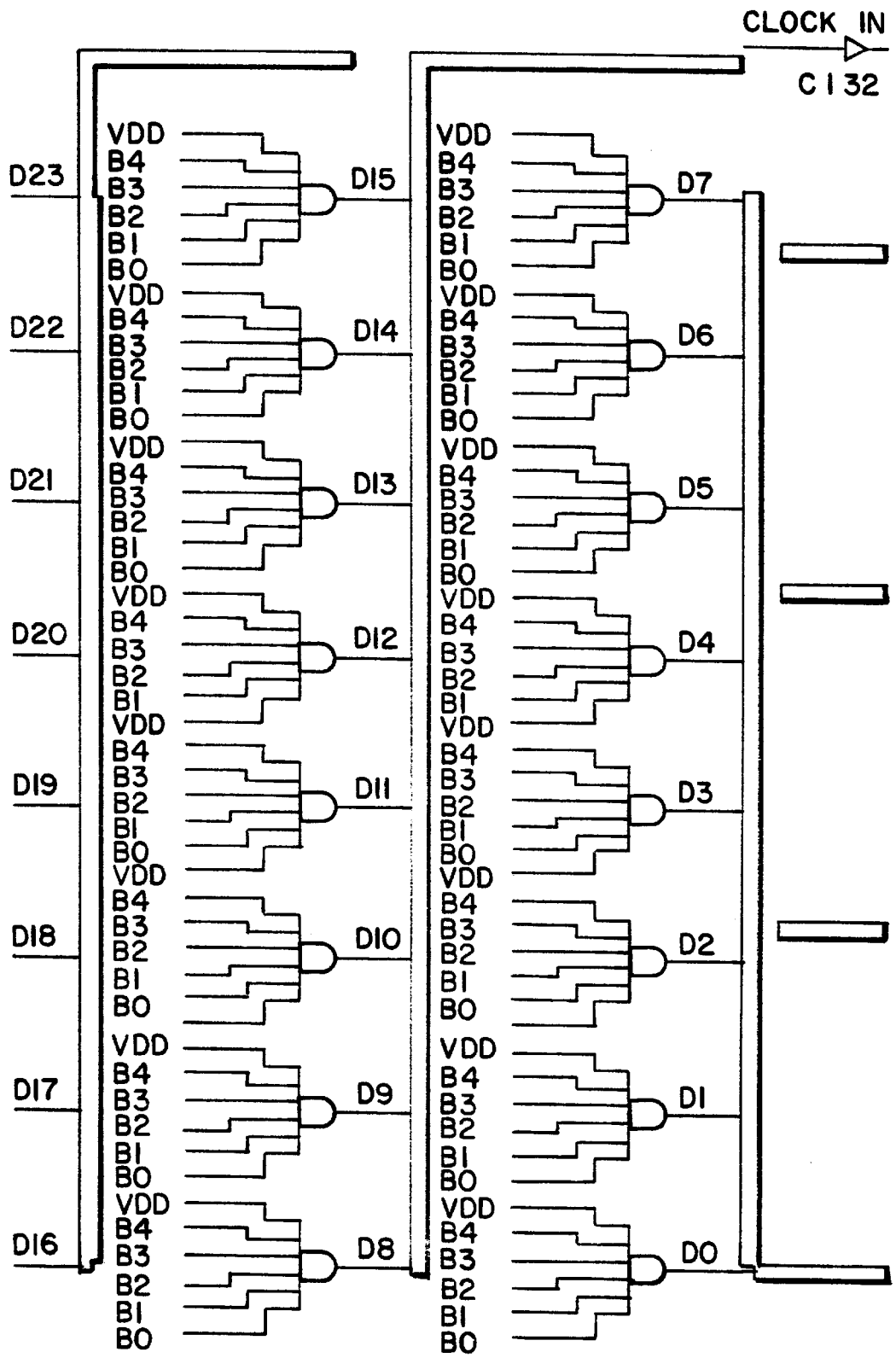
Figure 3C:
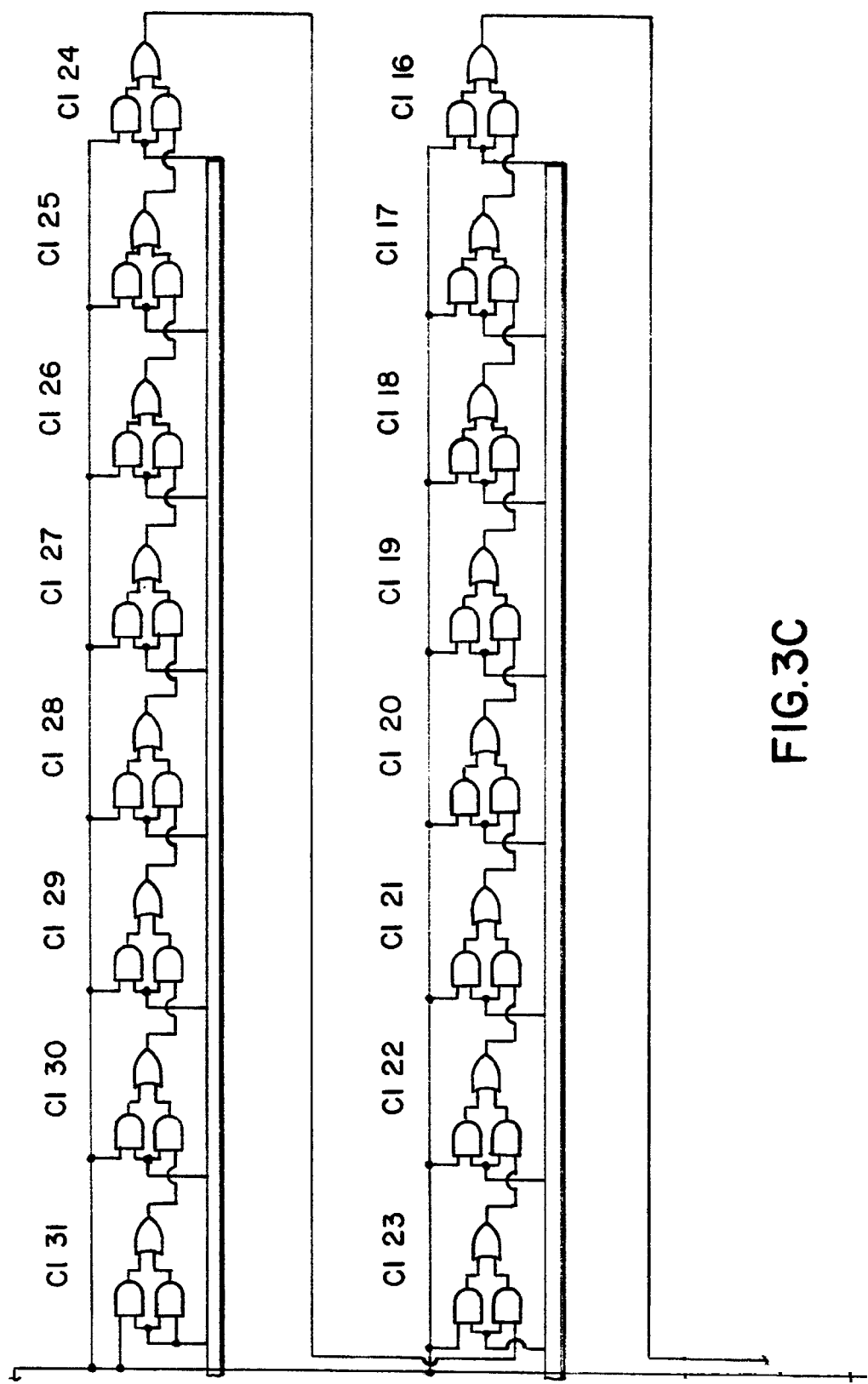
Figure 3D:
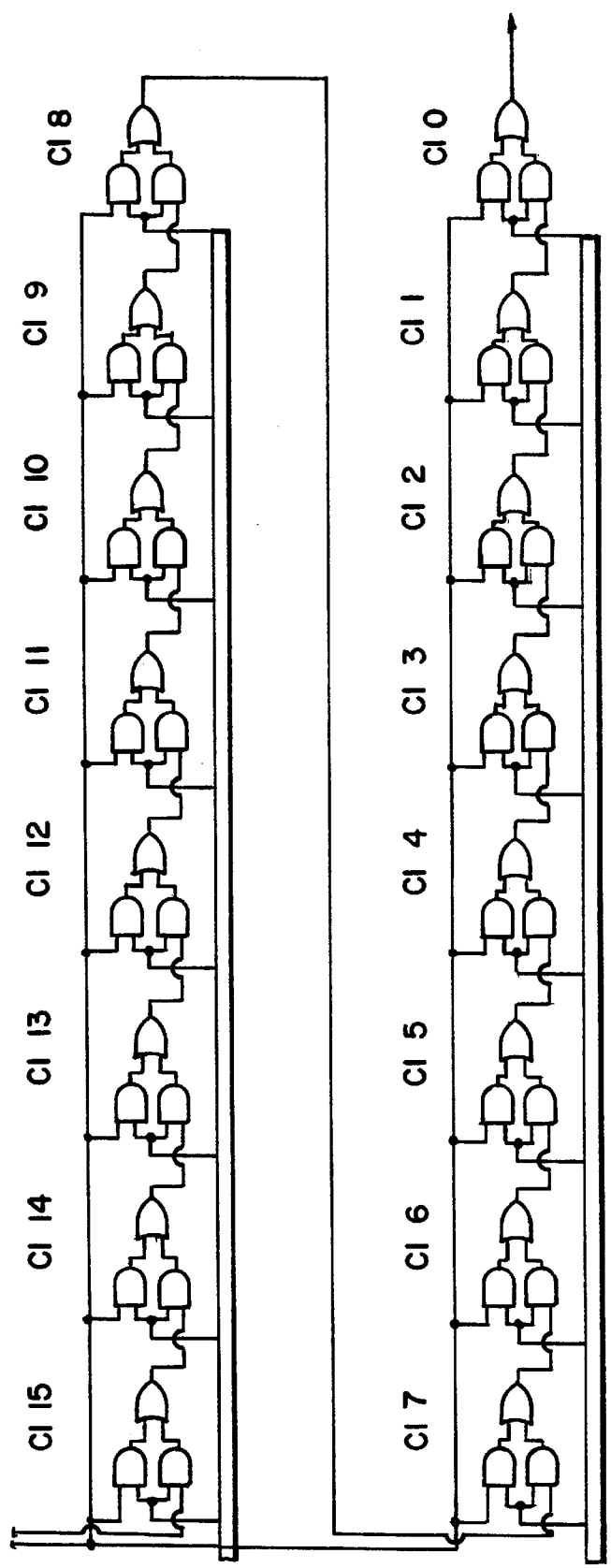

FIG. 3 illustrates a preferred PDL 30 which includes a string of thirty-two multiplexers, CI0 through CI31. Each multiplexer has an "A" input from the input clock and a "B" input from a previous multiplexer. The select line for multiplexers CI0 through CI31 in the delay string is generated from a decoder, with NAND gates D0 through D31 (corresponding to CI0 through CI31), which receives a delay count from up/down counter 60. As can be appreciated by those skilled in the art, stringing multiplexers CI0 through CI31 in such a manner allows any number multiplexer to start a delay string, to participate as a delay element in the string, or to be excluded from the delay string. In particular, the delay count of up/down counter 60 determines the "start" multiplexer, via the select line. Multiplexers in the delay string before the "start" multiplexer have no effect on the circuit. Multiplexers after the "start" multiplexer participate in the delay string. For example, if up/down counter 60 has a binary, delay count of 101 (i.e., the number 5), the "start" multiplexer is simply multiplexer CI5 and only multiplexers CI5 through CI0 would participate in the delay string.

As is understood by those skilled in the art, the delay count determines the number of multiplexers which are to participate in a delay string. The delay of the multiplexer determines the granularity of the programmable delay. As originally designed in an MPGA, this number was typically 400 pico seconds (maximum).

The following equation expresses the relationship between the number of multiplexers in the delay string, the amount of delay generated by each multiplexer, the period of REFCLK and an initial delay placed between REFCLK and PDL 30 (FIG. 2 shows this delay as delay element DL1), which are sufficient to ensure the proper operation of the described implementation. Thus, by selecting parameters consistent with the equation, clock compensation circuit 10 is assured that enough delay is available to shift the input clock one complete period.

$$M_q > (C_p - I_d)/M_d$$

where:

$M_q$=the minimum number of multiplexers required to shift the input clock one complete period.

$M_d$=the minimum delay of a single multiplexer.

$C_p$=the period of the reference clock.

$I_d$=an initial delay placed between REFCLK and PDL 30.

Selection of the number of multiplexers is important in the operation of clock compensation circuit 10. As originally designed, clock compensation circuit 10 uses a reference clock with a period ($C_p$) of 10.4 ns and has a minimum multiplexer delay ($M_d$) of 250 pico seconds and an initial delay ($I_d$) of 3.0 ns, thereby requiring 29.6 multiplexers. Thirty-two multiplexers CI0 through CI31 (FIG. 3) were used to provide a margin for error.

Figure 7:
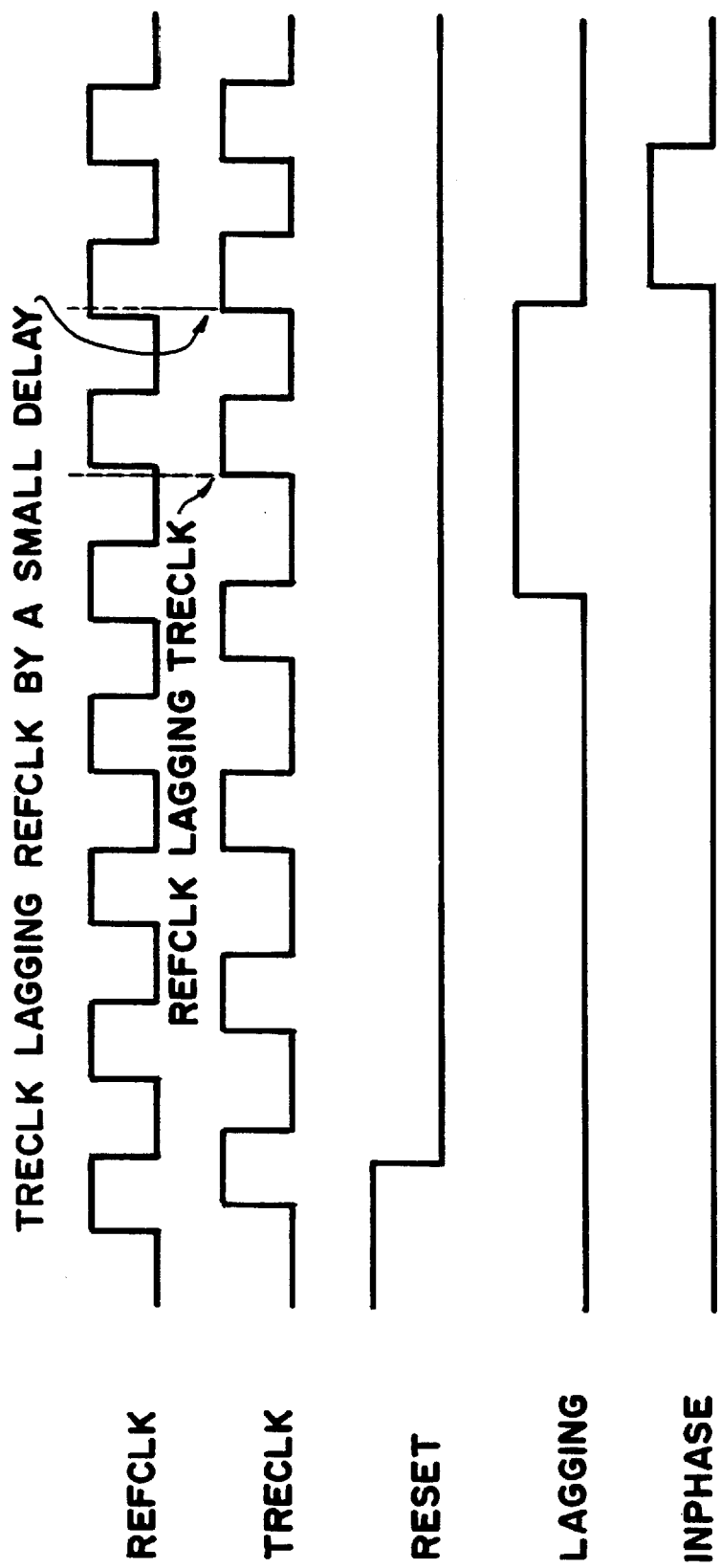
FIG. 7 is a timing diagram illustrating the operation of a preferred phase detector.

Referring to FIG. 7, at reset, the inputs of PDL 30 are set to 0 and TRECLK is delayed with respect to REFCLK (due to the clock tree delay). After reset is de-asserted, phase detector 90 forces INC true. On each rising edge of REFCLK, up/down counter 60 increments, thereby causing the delay through PDL 30 to increase. As the delay through PDL 30 increases, TRECLK is delayed with respect to REFCLK. Eventually, TRECLK is sufficiently delayed that it aligns in phase with the current REFCLK cycle. Phase detector 60 recognizes such event and clears its INC output. TRECLK is now considered to be "in phase" with REFCLK.

As temperature and voltage fluctuate, TRECLK will move with respect to REFCLK. As these events occur, phase detector 90 will assert INC or DEC (to increase or decrease delay) accordingly until the fluctuation is corrected. As can be appreciated by those skilled in the art, the delay between TRECLK and REFCLK will never exceed the maximum delay through one multiplexer of PDL 30 regardless of temperature, voltage or process. Clock compensation circuit 10 is therefore highly beneficial in high speed CMOS circuitry where fabrication process parameters, operating voltages, and operating temperatures can cause substantial variation of clock delays and clock skews. Further, clock compensation circuit 10 substantially reduces clock delay, thereby allowing more liberal clock buffering for minimizing clock skew.

What has been disclosed herein in accordance with the present invention is a clock compensation circuit comprising of a clock tree; a reference clock; a phase detector for detecting relative phase information of the tree clock and the reference clock; a controller, coupled to said phase detector, for determining and controlling the amount of delay necessary to shift the output of the clock tree in phase with the reference clock; and a programmable delay logic coupled to said controller. The programmable delay logic comprises a string of delay elements that selectively participate in a delay string for shifting the tree clock in phase with the reference clock.

The invention having thus described with particular reference to the preferred forms thereof, it will be obvious that various changes and modifications may be made therein without departing from the spirit and scope of the invention as defined in the appended claims.

I claim:

1. A clock compensation circuit for connection to a clock buffer, the clock buffer generating a clock buffer output signal (TRECLK) from an intermediate clock signal (CLKOUT), said clock compensation circuit comprising:

a programmable delay logic for receiving a reference clock signal(REFCLK) and generating said intermediate clock signal, said programmable delay logic including a plurality of delay elements coupled in series to form a string of delay elements participating in a delay string for delaying said reference clock signal to provide a phase relationship between said clock buffer output signal and said reference clock signal;

a phase detector for generating phase comparison signals related to phase differences between said clock buffer output signal and said reference clock signal; and a controller, responsive to said phase comparison signals, for selecting a first delay element from said string of delay elements to start said delay string, said delay elements prior to said selected first delay element being excluded from participating in said delay string and said delay elements subsequent to said selected first element participating in said delay string, wherein any delay element from said string of delay elements can be selected by said controller to start said delay string to provide a selected phase relationship between said clock buffer output signal and said reference clock signal.

2. A clock compensation circuit for connection to a clock buffer, the clock buffer generating a clock buffer output signal (TRECLK) from an intermediate clock signal (CLKOUT), said clock compensation circuit comprising:

a programmable delay logic for receiving a reference clock signal(REFCLK) and generating said intermediate clock signal, said programmable delay logic including a plurality of delay elements coupled in series to form a string of delay elements participating in a delay string for delaying said reference clock signal to provide a phase relationship between said clock buffer output signal and said reference clock signal;

a phase detector for generating phase comparison signals related to phase differences between said clock buffer output signal and said reference clock signal; and a controller, responsive to said phase comparison signals, for selecting a first delay element from said string of delay elements to start said delay string, said delay elements prior to said selected first delay element being excluded from participating in said delay string and said delay elements subsequent to said selected first element participating in said delay string, wherein said reference clock signal passes through only said delay elements subsequent to said selected first delay element to provide a selected phase relationship between said clock buffer output signal and said reference clock signal.

* * * * *